United States Patent
Lee et al.

(10) Patent No.: US 11,112,352 B2
(45) Date of Patent: Sep. 7, 2021

(54) SAW BASED OPTICAL SENSOR DEVICE AND PACKAGE INCLUDING THE SAME

(71) Applicant: HAESUNG DS CO., LTD., Changwon-si (KR)

(72) Inventors: Jin Woo Lee, Seoul (KR); Byung Moon Lee, Seoul (KR); Jin Kee Hong, Seoul (KR); Jong Woo Kim, Seoul (KR)

(73) Assignee: HAESUNG DS CO., LTD., Changwon-si (KR)

( * ) Notice: Subject to any disclaimer, the term of this patent is extended or adjusted under 35 U.S.C. 154(b) by 239 days.

(21) Appl. No.: 16/183,545

(22) Filed: Nov. 7, 2018

(65) Prior Publication Data
US 2019/0310183 A1   Oct. 10, 2019

(30) Foreign Application Priority Data
Apr. 5, 2018   (KR) .................. 10-2018-0040004

(51) Int. Cl.
*G01N 21/17*   (2006.01)
*H05K 1/02*   (2006.01)
(Continued)

(52) U.S. Cl.
CPC ....... *G01N 21/1702* (2013.01); *G01K 11/265* (2013.01); *G01L 9/0025* (2013.01);
(Continued)

(58) Field of Classification Search
CPC ........ G01J 1/429; G01J 1/42; G01N 21/1702; G01N 2021/1708; G01K 11/265;
(Continued)

(56) References Cited

U.S. PATENT DOCUMENTS 4,028,548 A  *  6/1977  Scott ..................... H01J 31/49
                                                          250/330
4,494,031 A  *  1/1985  Barnes ............... H03H 9/14502
                                                          310/313 B
(Continued)

FOREIGN PATENT DOCUMENTS

| CN | 106910720 A | 6/2017 |
|---|---|---|
| CN | 107110719 A | 8/2017 |

(Continued)

OTHER PUBLICATIONS

Huang et al, Application of Slanted Finger Inter-digital Transducer SAW Devices to Plural Ultraviolet Photodetectors, 2007 IEEE Ultrasonics Symposium (Year: 2007).*

(Continued)

*Primary Examiner* — David L Singer
(74) *Attorney, Agent, or Firm* — Schwabe, Williamson & Wyatt, P.C.

(57) ABSTRACT

Provided are an optical sensor device using surface acoustic waves and an optical sensor device package. The optical sensor device includes: a substrate including a first light sensing area and a temperature sensing area and including a piezo electric material; a first input electrode and a first output electrode which are disposed in the first light sensing area and are apart from each other with a first delay gap therebetween; a first sensing film overlapping the first delay gap and configured to cover at least some portions of the first input electrode and the first output electrode; and a second input electrode and a second output electrode which are disposed in the temperature sensing area and are apart from each other with a second delay gap therebetween. The second delay gap is exposed to air.

9 Claims, 13 Drawing Sheets

(51) Int. Cl.
*G01L 9/00* (2006.01)
*G01K 11/26* (2006.01)
*H05K 3/28* (2006.01)
*H05K 1/18* (2006.01)

(52) U.S. Cl.
CPC ... *H05K 1/0274* (2013.01); *G01N 2021/1708* (2013.01); *H05K 1/181* (2013.01); *H05K 3/284* (2013.01); *H05K 2201/0108* (2013.01); *H05K 2201/10121* (2013.01); *H05K 2201/10151* (2013.01); *H05K 2203/1316* (2013.01)

(58) Field of Classification Search
CPC ......... H05K 1/0274; H05K 2203/1316; H05K 2201/0108; H05K 2201/10151; H05K 2201/10121; H05K 3/284; H05K 1/181; G01L 9/0025; G01D 21/02
See application file for complete search history.

(56) References Cited

U.S. PATENT DOCUMENTS

| | | | | |
|---|---|---|---|---|
| 4,584,475 | A * | 4/1986 | Lao | G01J 5/34 250/332 |
| 5,012,668 | A * | 5/1991 | Haworth | G01N 29/022 310/313 B |
| 5,939,817 | A * | 8/1999 | Takado | H03H 9/1071 310/313 R |
| 5,992,215 | A * | 11/1999 | Caron | G01N 29/022 310/313 R |
| 6,049,155 | A | 4/2000 | Graebner et al. | |
| 6,661,084 | B1 * | 12/2003 | Peterson | H01L 25/16 257/680 |
| 6,674,159 | B1 * | 1/2004 | Peterson | H01L 27/14636 257/680 |
| 7,285,894 | B1 * | 10/2007 | da Cunha | H03H 9/02543 310/313 A |
| 8,596,862 | B1 * | 12/2013 | Pfeifer | G01K 11/265 374/117 |
| 9,934,419 | B2 | 4/2018 | Dong | |
| 10,222,257 | B2 * | 3/2019 | Kim | H03H 9/02976 |
| 10,749,066 | B2 * | 8/2020 | Lee | H01L 31/09 |
| 2002/0195697 | A1 * | 12/2002 | Mess | H01L 23/49575 257/686 |
| 2004/0026361 | A1 * | 2/2004 | Namba | H01L 21/6835 216/13 |
| 2005/0140293 | A1 * | 6/2005 | Kitahara | G01J 1/0204 313/542 |
| 2005/0223806 | A1 * | 10/2005 | Thundat | G01N 29/2418 73/590 |
| 2006/0096945 | A1 * | 5/2006 | Shen | H03H 3/08 216/2 |
| 2006/0113874 | A1 * | 6/2006 | Shen | H03H 9/059 310/340 |
| 2007/0052516 | A1 * | 3/2007 | Hines | B82Y 15/00 338/34 |
| 2009/0023400 | A1 * | 1/2009 | Nishio | H03B 5/36 455/91 |
| 2011/0068656 | A1 * | 3/2011 | Lee | G01N 29/2462 310/313 C |
| 2012/0161577 | A1 | 6/2012 | Abbott et al. | |
| 2014/0001918 | A1 * | 1/2014 | Lee | G01N 29/022 310/313 B |
| 2014/0042324 | A1 * | 2/2014 | Kropelnicki | G01J 5/44 250/340 |
| 2017/0125393 | A1 * | 5/2017 | Kwon | H01L 24/17 |
| 2017/0214381 | A1 * | 7/2017 | Bhattacharjee | H03H 9/0538 |
| 2017/0363483 | A1 | 12/2017 | Yuan et al. | |
| 2018/0062611 | A1 * | 3/2018 | Ha | H03H 9/1085 |
| 2018/0071780 | A1 * | 3/2018 | Friedt | B32B 27/308 |
| 2018/0143069 | A1 * | 5/2018 | Kim | G01J 1/429 |
| 2018/0143070 | A1 * | 5/2018 | Kim | G01V 8/00 |
| 2020/0028021 | A1 * | 1/2020 | Lee | H01L 31/024 |

FOREIGN PATENT DOCUMENTS

| | | | |
|---|---|---|---|
| EP | 2871474 B1 | 5/2015 | |
| JP | 59042420 A * | 3/1984 | ............... G01J 5/44 |
| JP | 59182679 A * | 10/1984 | ............... H04N 5/30 |
| JP | 62058763 A * | 3/1987 | |
| JP | 2015145808 A * | 8/2015 | |
| JP | 2017156253 A | 9/2017 | |
| KR | 20150135958 A | 12/2015 | |
| KR | 20170080108 A | 7/2017 | |
| TW | 201108477 A | 3/2011 | |
| WO | 2008152879 A1 | 12/2008 | |
| WO | 2017116116 A1 | 7/2017 | |

OTHER PUBLICATIONS

Cheng et al, A Photovoltaic UV Sensor With a Ferroelectric Thin Film on Transparent Substrate, IEEE Electron Device Letters, vol. 34, No. 11, Nov. 2013 (Year: 2013).*
Zhou et al, 2-Dimentional photoconductive MoS2nanosheets using in surfaceacoustic wave resonators for ultraviolet light sensing, Sensors and Actuators A 271 (2018) 389-397, Available online Dec. 6, 2017 (Year: 2017).*
Peng et al, Surface acoustic wave ultraviolet detector based on zinc oxide nanowire sensing layer, Sensors and Actuators A 184 (2012) 34-40 (Year: 2012).*
Peng et al, Performance improvement of ZnO nanowire based surface acoustic wave ultraviolet detector via poly(3,4-ethylenedioxythiophene) surface coating, Sensors and Actuators A 199 (2013) 149-155 (Year: 2013).*
Koh et al, Surface Acoustic Wave Ultraviolet Sensor Using Epitaxial AlGaN/(Al,Ga)N Film, 2006 IEEE Ultrasonics Symposium (Year: 2006).*
Chen et al, Suitability of Surface Acoustic Wave Oscillators Fabricated Using Low Temperature-Grown AlN Films on GaN/Sapphire as UV Sensors, IEEE transactions on ultrasonics, ferroelectrics, and frequency control, vol. 55, No. 2, Feb. 2008 (Year: 2008).*
Chen et al, Surface acoustic wave ultraviolet sensors based on ZnO nanorods, 2015 Ninth International Conference on Sensing Technology (Year: 2015).*
Chivukula et al, Capacitance Controlled n-GaN SAW UV Sensor, IEEE Sensors 2008 Conference (Year: 2008).*
Chivukula et al, ZnO nanoparticle surface acoustic wave UV sensor, Appl. Phys. Lett. 96, 233512 (Year: 2010).*
Phan et al, SAW UV Sensors Using ZnO Nanorods Grown on AlN/Si Structures, IEEE (Year: 2011).*
Sharma et al, Highly sensitive ultraviolet detector based on ZnO/LiNbO3 hybrid surface acoustic wave filter, Appl. Phys. Lett. 83, 3617 (Year: 2003).*
Ciplys et al, Ultraviolet-sensitive AlGaN-based Surface Acoustic Wave Devices, IEEE (Year: 2004).*
Lee et al, An ultraviolet sensor using spin-coated ZnO nanoparticles based on surface acoustic waves, Microelectronic Engineering 111 (2013) 105-109 (Year: 2013).*
Machine Translation JP 2017156253 A (Year: 2021).*
Machine Translation Second Office Action in Chinese Patent Application No. 201811441455.1, dated Jul. 29, 2021 (Year: 2021).*
First Office Action dated Jan. 28, 2021 for Chinese Patent Application No. 201811441455.1, 9 pgs.
Jo, et al. "Sensitivity improvement of the surface acoustic wave ultraviolet sensor based on zinc oxide nanoparticle layer with an ultrathin gold layer" from www.elsevier.com, dated Feb. 17, 2014, 8 pgs.
Second Office Action in Chinese Patent Application No. 201811441455.1, dated Jul. 29, 2021, 10 pages, English translation not available.
"Processes and Principles of Membrane Science and Technology", Yang Zuoguo, East China University of Science and Technology Press, pp. 287-292, Aug. 2009; 9 pages; with English translation.

* cited by examiner

SAW BASED OPTICAL SENSOR DEVICE AND PACKAGE INCLUDING THE SAME

CROSS-REFERENCE TO RELATED APPLICATION

This application claims the benefit of Korean Patent Application No. 10-2018-0040004, filed on Apr. 5, 2018, in the Korean Intellectual Property Office, the disclosure of which is incorporated herein in its entirety by reference.

BACKGROUND

1. Field

One or more embodiments relate to an optical sensor device, and more particularly, to an optical sensor device capable of measuring illumination intensity and/or ultraviolet rays using surface acoustic waves and an optical sensor device package including the optical sensor device.

2. Description of the Related Art

Optical sensors are sensors that measure an amount or a frequency of light. Such optical sensors are manufactured by mainly using photodiodes. However, optical sensors using the photodiodes include amplifying circuits and thus are vulnerable to noise.

Surface acoustic wave technology using a principle, in which mechanical energy is converted into electrical energy or electrical energy into mechanical energy, may be relatively robust to noise. Accordingly, technology using surface acoustic waves by using biosensors has been introduced, but existing surface acoustic wave sensors are too big to be used as sensors in mobile or wearable devices.

SUMMARY

One or more embodiments include an optical sensor device using surface acoustic waves which has a small size but high measurement reliability, and an optical sensor device package.

Additional aspects will be set forth in part in the description which follows and, in part, will be apparent from the description, or may be learned by practice of the presented embodiments.

According to one or more embodiments, an optical sensor device includes: a substrate including a first light sensing area and a temperature sensing area and including a piezo electric material; a first input electrode and a first output electrode which are disposed in the first light sensing area and are apart from each other with a first delay gap between the first input electrode and the first output electrode; a first sensing film overlapping the first delay gap and configured to cover at least some portions of the first input electrode and the first output electrode; and a second input electrode and a second output electrode which are disposed in the temperature sensing area and are apart from each other with a second delay gap between the second input electrode and the second output electrode. The second delay gap is exposed to air.

The first input electrode may be configured to receive a first electrical signal and provide a first input acoustic wave to the first light sensing area, the first output electrode may be configured to output a first output acoustic wave modulated by the first sensing film of which properties change according to external light, the second input electrode may be configured to receive a second electrical signal and provide a second input acoustic wave to the temperature sensing area, and the second output electrode may be configured to output a second output acoustic wave modulated by the substrate of which properties change according to a temperature.

The first output acoustic wave may have a first peak and a second peak in a range from about 200 MHz to about 300 MHz, a Q factor at the first peak may be between about 200 and about 600, and a difference between insertion losses of the first peak and the second peak may be equal to or greater than 3 dB.

The first input electrode and the first output electrode may include Inter Digit Transducer (IDT) electrodes including a plurality of fingers having comb shapes, and the first sensing film may be configured to cover all of the plurality of fingers.

The number of fingers included in the first input electrode and the first output electrode may be between 35 and 121.

The optical sensor device may further include a ground electrode disposed between the first light sensing area and the temperature sensing area, and the first input electrode and the second input electrode may be symmetrically disposed with respect to the ground electrode.

The first input electrode, the first output electrode, the second input electrode, and the second output electrode may include a plurality of IDT fingers and a plurality of bar electrodes. The first input electrode, the first output electrode, the second input electrode, and the second output electrode may be aligned in a row on a side of the substrate, and lengths of the plurality of bar electrodes of the first output electrode and the second output electrode may be different from lengths of the plurality of bar electrodes of the first input electrode and the second input electrode.

The first input electrode, the first output electrode, the second input electrode, and the second output electrode may include a plurality of IDT electrodes including a plurality of IDT fingers and a plurality of bar electrodes. A first aperture, which is a length in which the plurality of IDT fingers included in the first input electrode cross and overlap each other, is greater than a second aperture which is a length of the plurality of IDT fingers included in each of the second input electrode.

The substrate may include a second light sensing area that is close to the first light sensing area. In the second light sensing area, a third input electrode, a third output electrode, which are apart from each other with a third delay gap between the third input electrode and the third output electrode, and a second sensing film configured to cover the third delay gap may be disposed. One of the first sensing film and the second sensing film may be configured to detect visible light, and the other of the first sensing film and the second sensing film may be configured to detect ultraviolet rays.

According to one or more embodiments, an optical sensor package includes: a printed circuit board including a first bonding pad area and a second bonding pad area; an optical sensor device disposed on the printed circuit board and connected to the first bonding pad area through wire bonding; an integrated circuit (IC) chip disposed on the printed circuit board and connected to the second bonding pad area; molding portions surrounding the optical sensor device and molding the second bonding pad area and a read out integrated circuit (ROIC); and a transparent substrate disposed on the molding portions and forming an air gap with the optical sensor device. The optical sensor device includes: a substrate including a first light sensing area and a temperature sensing area and including a piezo electric material; a first input electrode and a first output electrode which are disposed in the first light sensing area and are apart from each other with a first delay gap between the first input electrode and the first output electrode; a first sensing film overlapping the first delay gap and configured to cover at least some portions of the first input electrode and the first output electrode; and a second input electrode and a second output electrode which are disposed in the temperature sensing area and are apart from each other with a second delay gap between the second input electrode and the second output electrode. The second delay gap is exposed to air.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
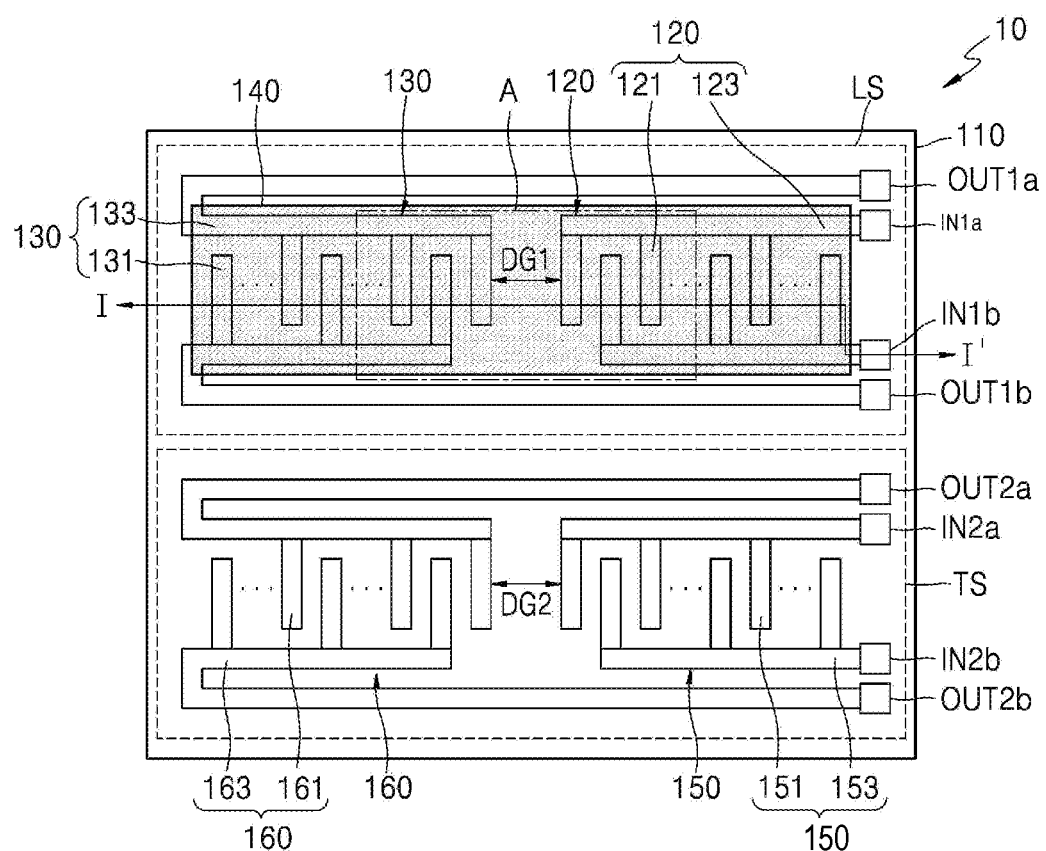
FIG. 1A is a schematic plan view of an optical sensor device according to an embodiment.

As the disclosure allows for various changes and numerous embodiments, particular embodiments will be illustrated in the drawings and described in detail in the written description. The attached drawings for illustrating embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein. As used herein, the term "and/or" includes any and all combinations of one or more of the associated listed items. Expressions such as "at least one of", when preceding a list of elements, modify the entire list of elements and do not modify the individual elements of the list.

Hereinafter, the present disclosure will be described in detail by explaining embodiments of the disclosure with reference to the attached drawings. Like reference numerals in the drawings denote like elements, and thus their description will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

It will be understood that when a layer, region, or component is referred to as being "connected to" another layer, region, or component, it can be directly on the other layer, region, or component or intervening layers, regions, or components may be present therebetween. In the present specification, for example, when a layer, region, or component is referred to as being electrically connected to another layer, region, or component directly or indirectly.

Figure 1B:
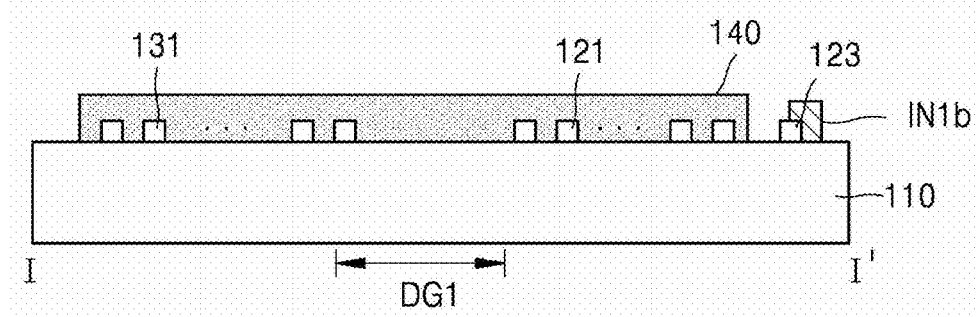
FIG. 1B is a cross-sectional view taken along a line I-I' of FIG. 1A.
Figure 2:
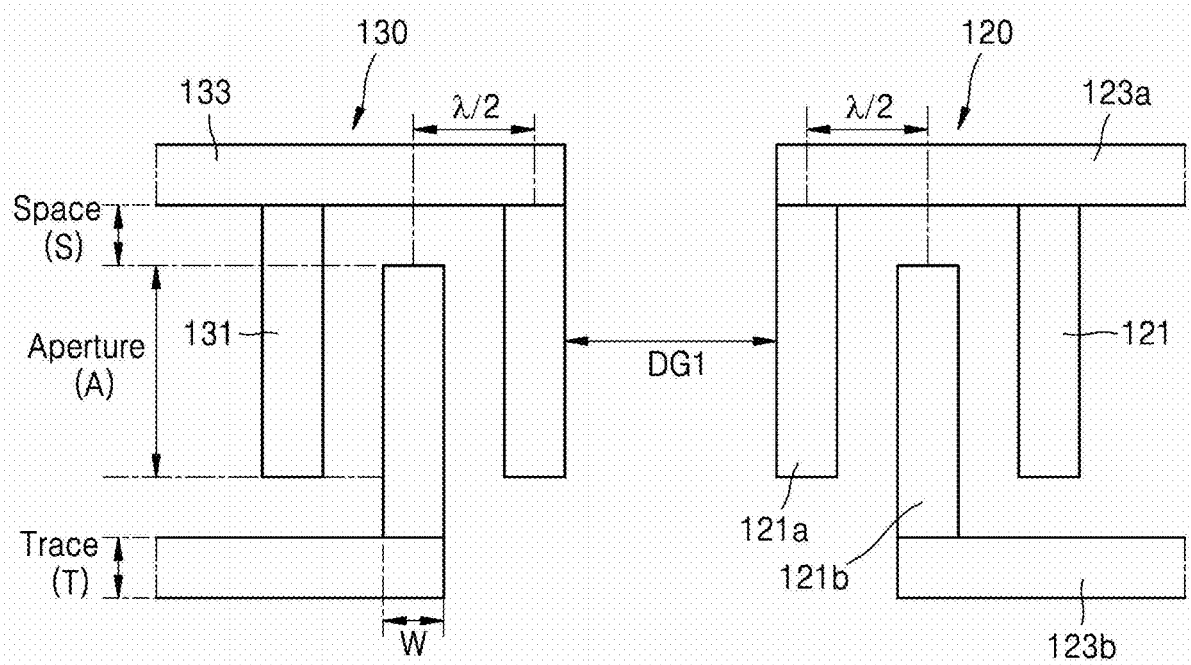
FIG. 2 is a plan view showing an area A of FIG. 1A.

FIG. 1A is a schematic plan view of an optical sensor device 10 according to an embodiment. FIG. 1B is a cross-sectional view taken along a line I-I' of FIG. 1A. FIG. 2 is a plan view showing an area A of FIG. 1A.

Referring to FIGS. 1A to 2, the optical sensor device 10 includes a light sensing area LS, which is prepared to sense light, and a temperature sensing area TS, which is prepared to measure a temperature, on a substrate 110 including a piezo-electric material. In the light sensing area LS, a first input electrode 120, a first output electrode 130, and a sensing film 140 are disposed, and in the temperature sensing area TS, a second input electrode 150 and a second output electrode 160 are disposed.

The first input electrode 120 and the first output electrode 130 are apart from each other with a first delay gap DG1 therebetween, and the sensing film 140 is disposed by covering at least some portions of the first input electrode 120 and the first output electrode 130. The second input electrode 150 and the second output electrode 160 are apart from each other with a second delay gap DG2 therebetween, and the second delay gap DG2 is exposed to air.

The optical sensor device 10 according to the present embodiment may be a device capable of measuring a light amount and a temperature based on a change in surface acoustic waves. That is, the first input electrode 120 may provide first input acoustic waves to the light sensing area LS after receiving a first electrical signal, and the first output electrode 130 may output first output acoustic waves that are modulated by the sensing film 140 having properties changing according to external light.

The second input electrode 150 may provide second input acoustic waves to the temperature sensing area TS after receiving a second electrical signal, and the second output electrode 160 may output second output acoustic waves that are modulated by the substrate 110 having properties changing according to a temperature.

That is, the substrate 100 may include a piezo electric material capable of generating surface acoustic waves in response to electrical signals, and the material of the substrate 100 may be selected from among piezo electric materials and may have properties changing according to the temperature. For example, the substrate 100 may include $LiNbO_3$ (LN) or $LiTaO_3$ (LT). In some embodiments, the substrate 100 may include a piezo electric material of which a conversion rate $K^2$ of converting mechanical energy into electrical energy is at least 5% and a temperature coefficient (TDC) is 50 ppm/° C.

The sensing film 140 includes a material used to detect visible light or ultraviolet rays, and the material may have properties changing in reaction to the visible light or ultraviolet rays. That is, the sensing film 140 may receive light and may change propagation velocity of acoustic waves propagating through the substrate 110.

When the sensing film 140 detects visible light, the sensing film 140 may include CdS or CdSe. The sensing film 140 may be formed by depositing CdS or CdSe, and a thickness of the sensing film 140 may be between about 50 nm and about 300 nm.

When the sensing film 140 detects ultraviolet rays, the sensing film 140 may include zinc oxide (ZnO) or gallium nitride (GaN). In some embodiments, the sensing film 140 may be formed by depositing ZnO, and in this case, the thickness of the sensing film 140 may be between about 50 nm and about 300 nm. In other embodiments, the sensing film 140 may be formed by spin-coating ZnO nano particles. In this case, the thickness of the sensing film 140 may be between about 500 nm and about 1500 nm.

The first input electrode 120 may form an electric field by receiving an external electrical signal, and the substrate 110 may generate surface acoustic waves that are mechanical vibrations by using the electric field. The generated surface acoustic waves are provided to the sensing film 140.

The first output electrode 130 may be apart from the first input electrode 120 with the first delay gap DG1 therebetween and may generate surface acoustic waves, which are changed by the sensing film 140, into electrical signals, thereby outputting the electrical signals. For example, when the sensing film 140 includes ZnO used to detect ultraviolet rays, a center frequency of acoustic waves may move several MHz, according to a detected amount of ultraviolet rays. When the sensing film 140 includes CdS or CdSe used to detect visible light, the center frequency of the acoustic waves may move several tens to hundreds of KHz according to the detected light amount.

The first input electrode 120 and the first output electrode 130 may be Inter Digital Transducer (IDT) electrodes. The IDT electrodes may include a plurality of IDT fingers 121 and 131 having comb shapes and two bar electrodes 123 and 133 respectively connected to the IDT fingers 121 and 131.

The bar electrode 123 of the first input electrode 120 may be connected to first input pads IN1a and IN1b, and the bar electrode 133 of the first output electrode 130 may be connected to first output pads OUT1a and OUT1b. Any one of the first input pads IN1a and IN1b and any one of the first output pads OUT1a and OUT1b may be used as ground electrode pads.

The second input electrode 150 may form an electric field by receiving external electrical signals, and the substrate 110 may generate the surface acoustic waves that are the mechanical vibrations by using the formed electric field.

The second output electrode 160 may be apart from the second input electrode 150 with the second delay gap DG2 therebetween and may generate the acoustic waves, which are transmitted along a surface of the substrate 110, into electrical signals, thereby outputting the electrical signals. Since the properties of the substrate 110 may change according to the temperature, properties of the acoustic waves applied to the second output electrode 160 may differ according to the temperature.

The second input electrode 150 and the second output electrode 160 may be IDT electrodes. The IDT electrodes may include a plurality of IDT fingers 151 and 161 having comb shapes and two bar electrodes 153 and 163 respectively connected to the IDT fingers 151 and 161.

The bar electrode 153 of the second input electrode 150 may be connected to second input pads IN2a and IN2b, and the bar electrode 163 of the second output electrode 160 may be connected to second output pads OUT2a and OUT2b. Any one of the second input pads IN2a and IN2b and any one of the second output pads OUT2a and OUT2b may be used as ground electrode pads.

In some embodiments, the first input electrode 120, the first output electrode 130, the second input electrode 150, and the second output electrode 160 may include aluminum (Al), and thicknesses of the first input electrode 120, the first output electrode 130, the second input electrode 150, and the second output electrode 160 may be between about 100 nm and about 300 nm.

The first input pads IN1a and IN1b, the first output pads OUT1a and OUT1b, the second input pads IN2a and IN2b, and the second output pads OUT2a and OUT2b are aligned on one side of the substrate 110. Lengths of the bar electrode 123 of the first input electrode 120 and the bar electrode 133 of the first output electrode 130 may differ from each other, and lengths of the bar electrode 153 of the second input electrode 150 and the bar electrode 163 of the second output electrode 160 may differ from each other.

In some embodiments, the length of the bar electrode 123 of the first input electrode 120 may be less than that of the bar electrode 133 of the first output electrode 130, and the length of the bar electrode 153 of the second input electrode 150 may be less than that of the bar electrode 163 of the second output electrode 160.

Due to the alignment of the aforementioned electrode pads, that is, the first input and output pads IN1a, IN1b, IN2a, and IN2b and the second input and output pads OUT1a, OUT1b, OUT2a, and OUT2b, the total size of the optical sensor device 10 may be reduced, and accordingly, the total size of an optical sensor device package, in which the optical sensor device 10 is packaged, may be reduced.

The optical sensor device 10 according to the present embodiment has the light sensing area LS and the temperature sensing area TS and thus simultaneously measures the light amount and the temperature. The light amount and the temperature may be derived from a difference between center frequencies of the input acoustic waves and the output acoustic waves. In other words, the light amount may be derived from a difference $\Delta fc1$ between a center frequency $fc\_in1$ of the first input acoustic waves and a center frequency $fc\_out1$ of the first output acoustic waves, and the temperature may be derived from a difference $\Delta fc2$ between a center frequency $fc\_in2$ of the second input acoustic waves and a center frequency $fc\_out2$ of the second output acoustic waves. Relations or tables of the differences Δfc1 and Δfc2 and the light amount and/or the temperature are stored in a central processing unit (CPU) of a controller, etc. that is connected to the optical sensor device 10, and thus the light amount and the temperature may be derived by measuring the differences Δfc1 and Δfc2.

A temperature change of the substrate 110 is reflected to a value of the center frequency fc_out1 of the first output acoustic waves used to measure the light amount, and the second output acoustic waves used to measure the temperature may be used as a reference value with respect to the first output acoustic waves. The center frequency fc_out2 of second output acoustic waves may be a parameter for measuring the temperature and may also be used as a reference value used to measure the light amount from which temperature properties are excluded.

The optical sensor device 10 according to the present embodiment is designed to have a tiny size of less than about 2.5 mm×2.5 mm. Also, in order to minimize a size of an integrated circuit (IC) chip, for example, a read out integrated circuit (ROIC), which is connected to the optical sensor device 10 and detects a frequency change of the acoustic waves, Q values of the acoustic waves obtained by the optical sensor device 10 are set to be greatly high.

To satisfy the conditions, the sensing film 140 that detects the light amount may cover the IDT fingers 121 of the first input electrode 120 and the IDT fingers 131 of the first output electrode 130. The purpose of such alignment is to maximally secure a detection area to correspond to a spatial limit of the optical sensor device 10 and restrict at most reflective waves that may be generated due to the reflection. In an embodiment, an area of the sensing film 140 may range from about 0.5 mm$^2$ to about 1.25 mm$^2$.

The center frequency of the acoustic waves that are output from the optical sensor device 10 may be set to be between about 200 MHz and about 300 MHz because, when the center frequency is equal to or greater than 300 MHz, noise increases, and thus a design of the ROIC may become complicated, or a size thereof may increase, and when the center frequency is less than or equal to 200 MHz, sizes of input and output electrodes increase.

When the center frequency of the acoustic waves that are output from the optical sensor device 10 is referred to as a first peak, a value of a Q factor (a bandwidth/center frequency of 3 dB) at the first peak may be great. In this way, frequency sweeping in the ROIC is reduced by reducing a bandwidth of the first peak, and it is easy to identify a change in a first peak value. In some embodiments, the Q factor at the first peak may be between about 200 and about 600, and preferably between about 240 and about 500, which means that the bandwidth of 3 dB is set to be less than or equal to about 1 MHz and equal to or greater than about 0.5 MHz.

Also, the acoustic waves output from the optical sensor device 10 may have a second peak having a next insertion loss other than the center frequency (the first peak), and thus, a difference between insertion losses of the first and second peaks may be designed to be equal to or greater than 3 dB. As the difference between insertion losses of the first and second peaks increases, the first peak may not be confused with the second peak and the capacity of the ROIC may be reduced.

In the present embodiment, the following design parameters have been secured to ensure that the spatial limit is less than or equal to 2.5 mm×2.5 mm, the difference between the insertion losses of the first and second peaks is equal to or greater than 3 dB, and the Q factor at the first peak is between about 200 and about 600.

First of all, the number of IDT fingers included in each of the first input electrode 120 and the first output electrode 130 may preferably be between about 35 and about 121.

Also, referring to FIG. 2, a distance between a center of one finger 121a of the first fingers 121 and that of an adjacent finger 121b may be adjusted to be about λ/2, and λ/2 may range from about 6.6 um to about 10 um. A width of one of the first fingers 121 and the second fingers 131 may be between about 3.3 um to and about 4.1 um. The first delay gap DG1 may be between about 15 um and about 600 um. An aperture, which is a length obtained as the one finger 121a of the first fingers 121 connected to a first bar electrode 123a of the first input electrode 120 crosses and overlaps the adjacent finger 121b connected to a second bar electrode 123b of the first input electrode 120, may be between about 30 um and about 650 um.

Figure 3:
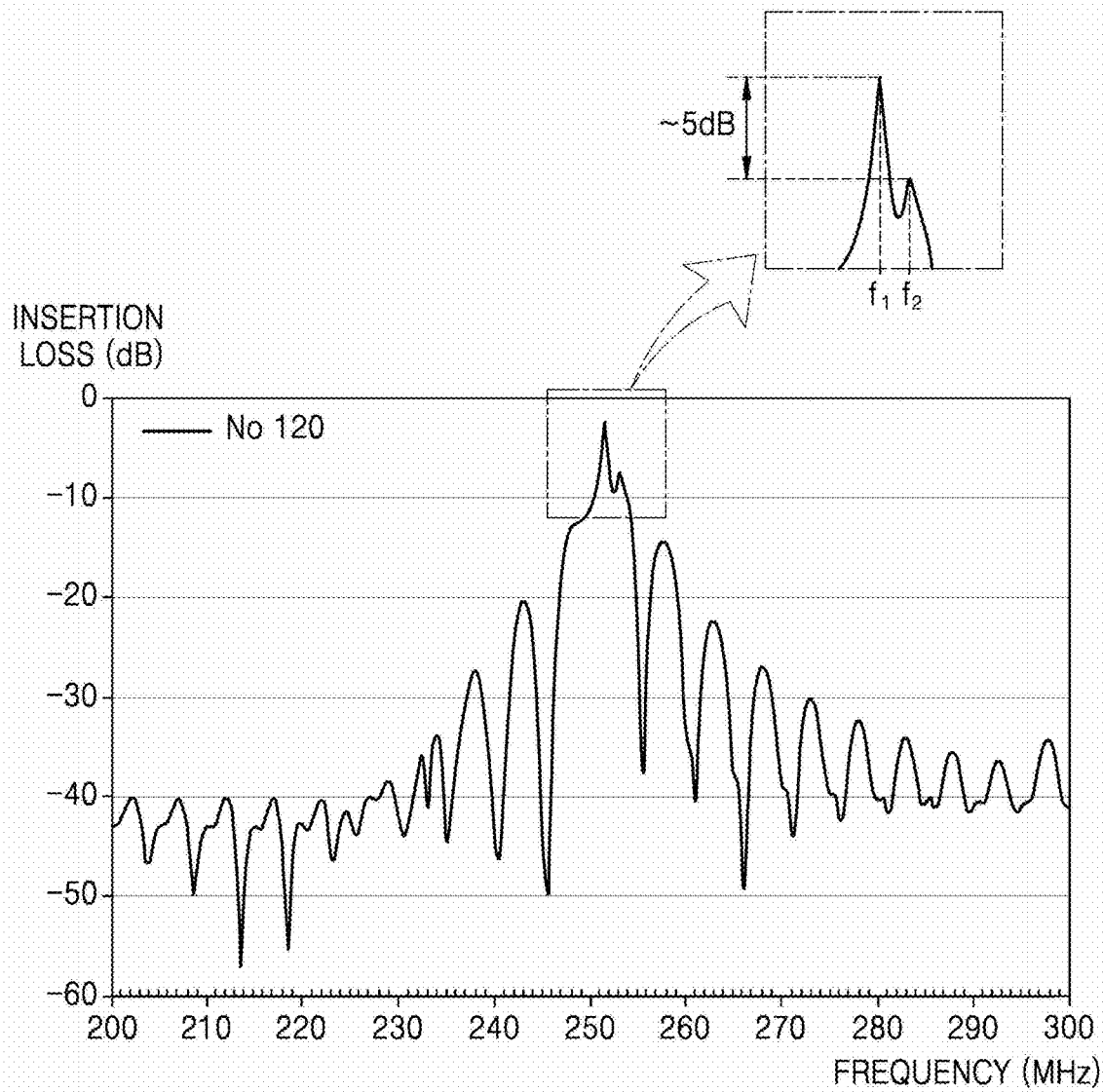
FIG. 3 is a graph showing a simulation of a frequency response characteristic of an optical sensor device designed according to an embodiment.
Figure 4:
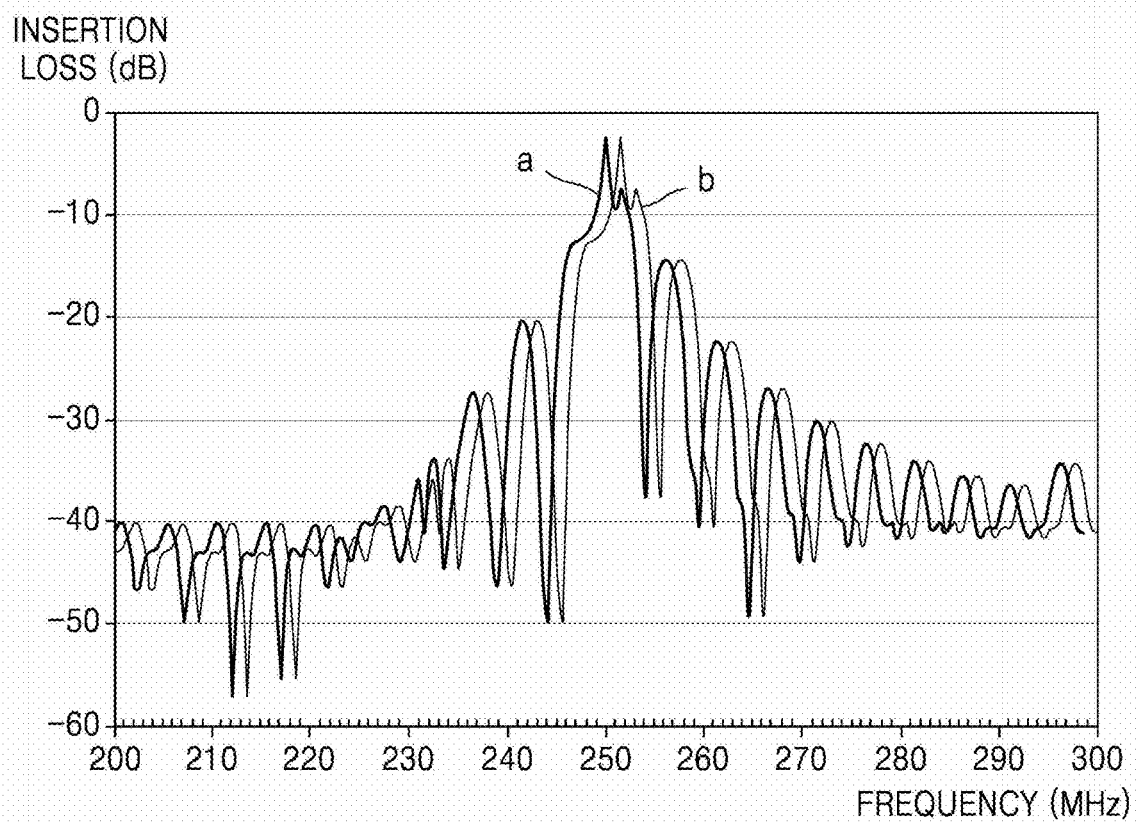
FIG. 4 is a graph showing a simulation of a frequency movement characteristic of the optical sensor device designed according to an embodiment.

FIGS. 3 and 4 are graphs showing simulations of frequency response characteristics of an optical sensor device designed by applying the above parameters thereto.

Referring to FIG. 3, the x axis indicates frequency, and the y axis indicates insertion loss. A first peak f1 is at about 255 MHz, and a Q value at the first peak is about 250, which means that characteristics of a center frequency are highly sharp. In addition, a difference between insertion losses of the first peak f1 and a second peak f2 is about 5 dB, and thus, it may be easy to distinguish the first peak f1 and the second peak f2 from each other.

FIG. 4 shows frequency application characteristics of acoustic waves in a case a where light is not transmitted and a case b where light (e.g., ultraviolet rays) is transmitted. When light is transmitted, the center frequency changes in proportion to the light amount, and thus, it is possible to measure light transmission and an amount of transmitted light.

Figure 5:
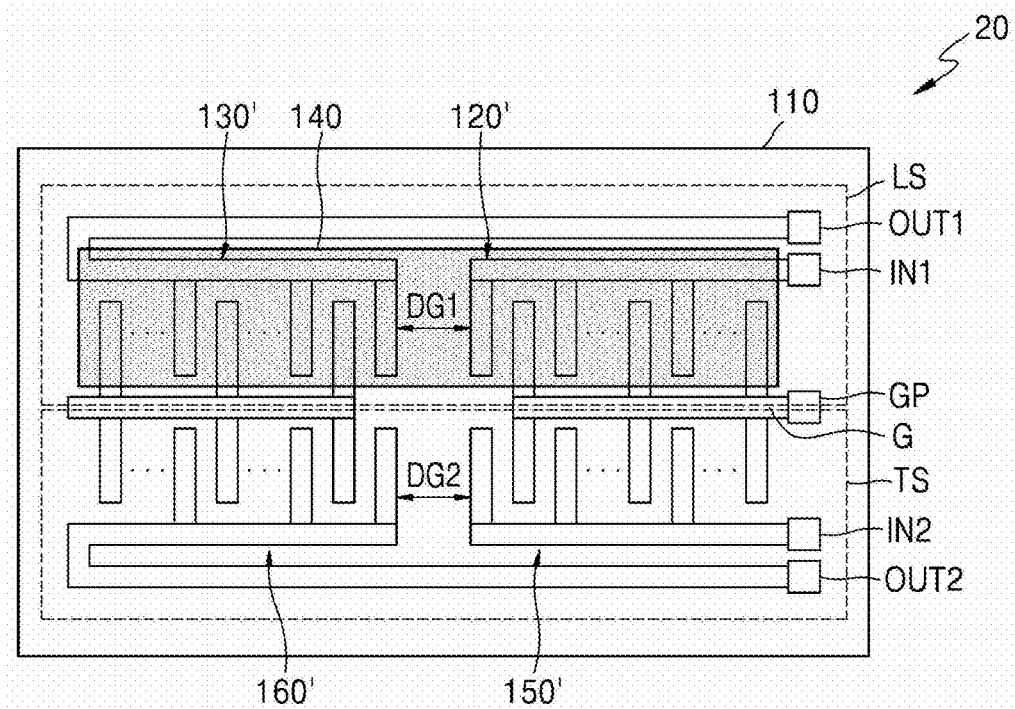
FIG. 5 is a schematic plan view of an optical sensor device according to another embodiment.

FIG. 5 is a schematic plan view of an optical sensor device 20 according to another embodiment. Like reference numerals in FIGS. 1A and 5 denote like elements, and thus their descriptions will be omitted.

Referring to FIG. 5, the optical sensor device 20 has a light sensing area LS and a temperature sensing area TS, and in the light sensing area LS, a first input electrode 120', a first output electrode 130', and the sensing film 140 are disposed, and in the temperature sensing area TS, a second input electrode 150' and a second output electrode 160' are disposed.

The first input electrode 120' and the first output electrode 130' are apart from each other with the first delay gap DG1 therebetween, and the sensing film 140 is disposed by covering at least some portions of the first input electrode 120' and the first output electrode 130'. The second input electrode 150' and the second output electrode 160' are apart from each other with the second delay gap DG2 therebetween, and the second display gap DG2 is exposed to air.

In the present embodiment, a ground electrode G is disposed on a boundary of the light sensing area LS and the temperature sensing area TS. The ground electrode G may be connected to a ground pad GP.

The ground electrode G may function as a common ground with respect to the first and second input acoustic waves. Accordingly, with respect to the ground electrode G, a first input electrode 120' and a second input electrode 150' may be symmetrically disposed. That is, the first input acoustic waves may be transmitted to the substrate 110 and the sensing film 140 through the first input electrode 120' and the ground electrode G, and the second input acoustic waves may be transmitted to the substrate 110 through the second input electrode 150' and the ground electrode G.

The first input electrode 120' may be connected to a first input pad IN1, and the second input electrode 150' may be connected to a second input pad IN2. The first output electrode 130' may be connected to a first output pad OUT1, and the second output electrode 160' may be connected to a second output pad OUT2. The ground electrode G may be connected to the ground pad GP.

Since the ground electrode G functions as a common ground with respect to the first and second input acoustic waves, the number of electrodes and electrode pads may decrease, and thus, the total size of the optical sensor device 20 may be reduced.

Figure 6:
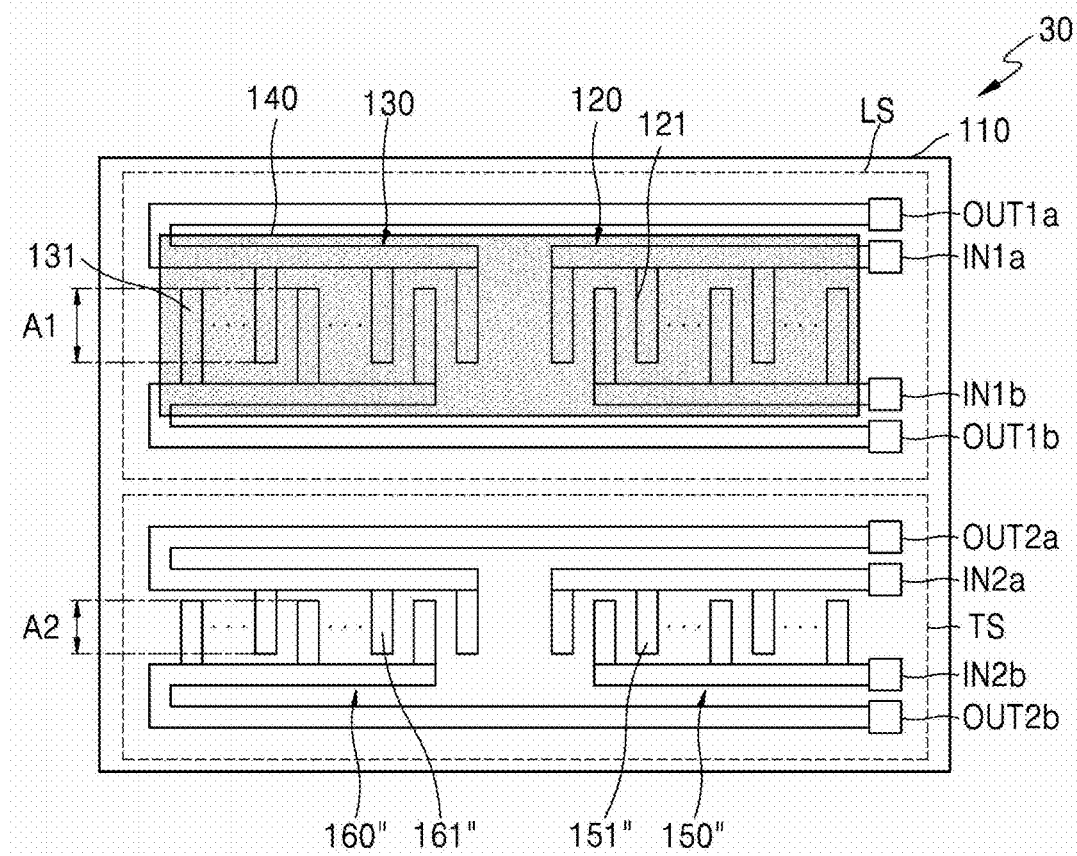
FIG. 6 is a schematic plan view of an optical sensor device according to another embodiment.

FIG. 6 is a schematic plan view of an optical sensor device 30 according to another embodiment. Like reference numerals in FIGS. 1A and 6 denote like elements, and thus their descriptions will be omitted.

Referring to FIG. 6, the optical sensor device 30 has a light sensing area LS and a temperature sensing area TS. In the light sensing area LS, the first input electrode 120, the first output electrode 130, and the sensing film 140 are disposed, and in the temperature sensing area TS, a second input electrode 150" and a second output electrode 160" are disposed.

The first input electrode 120 and the first output electrode 130 are apart from each other with the first delay gap DG1 therebetween, and the sensing film 140 covers at least some portions of the first input electrode 120 and the first output electrode 130. The second input electrode 150" and the second output electrode 160" are apart from each other with the second delay gap DG2 therebetween, and the second delay gap DG2 is exposed to air.

In the present embodiment, an area occupied by the temperature sensing area TS may be narrower than an area occupied by the light sensing area LS. A sensing film is not disposed in the temperature sensing area TS, and due to characteristics of a physical property change of the substrate 110 according to the temperature, the temperature sensing area TS may be narrower than the light sensing area LS.

In particular, a length of a first aperture A1, in which the IDT fingers 121 cross and overlap each other, may be greater than a length of a second aperture A2 in which an IDT fingers 151" cross and overlap each other. That is, the length of the second aperture A2 may be less than that of the first aperture A1, and thus, the total size of the optical sensor device 30 may be reduced.

Alternatively, the lengths of the IDT fingers 151" of the second input electrode 150" and the IDT fingers 161" of the second output electrode 160" may be less than those of the lengths of the IDT fingers 121 of the first input electrode 120 and the IDT fingers 131 of the first output electrode 130. Accordingly, the total size of the optical sensor device 30 may be reduced.

Figure 7:
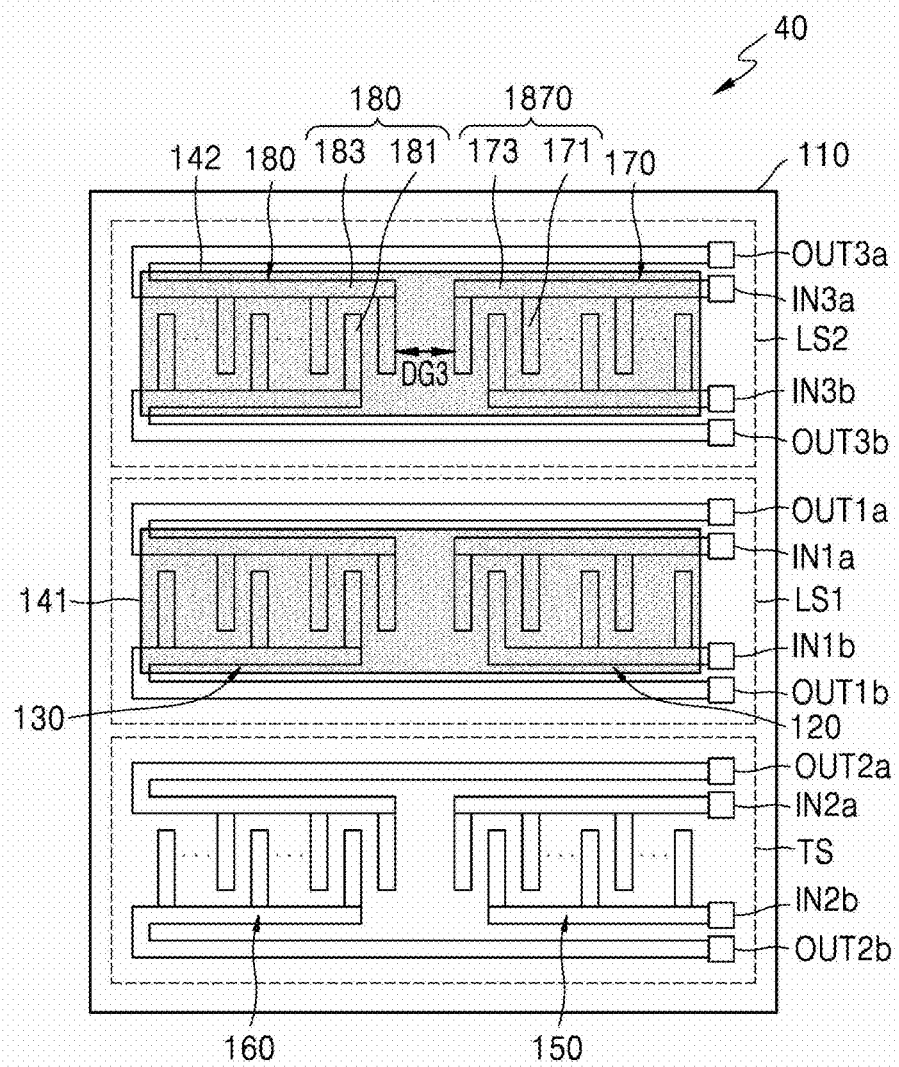
FIG. 7 is a schematic plan view of an optical sensor device according to another embodiment.

FIG. 7 is a schematic plan view of an optical sensor device 40 according to another embodiment. Like reference numerals in FIGS. 1A and 7 denote like elements, and thus their descriptions will be omitted.

Referring to FIG. 7, the optical sensor device 40 has a first light sensing area LS1, a second light sensing area LS2, and a temperature sensing area TS. In the first light sensing area LS1, the first input electrode 120, the first output electrode 130, and a first sensing film 141 are disposed, and in the second light sensing area LS2, a third input electrode 170, a third output electrode 180, and a second sensing film 142 are disposed. The third input electrode 170 is apart from the third output electrode 180 with a third delay gap DG3. In the temperature sensing area TS, the second input electrode 150 and the second output electrode 160 are disposed.

One of the first light sensing area LS1 and the second light sensing area LS2 may be an area where visible light is detected, and the other thereof may be an area where ultraviolet rays are detected. That is, one of the first sensing film 141 and the second sensing film 142 may detect the visible light, and the other thereof may detect the ultraviolet rays.

For example, when the first sensing film 141 includes a material used to detect the visible light, the second sensing film 142 may include a material used to detect the ultraviolet rays.

The first sensing film 141 may include CdS or CdSe. The first sensing film 141 may be formed by depositing CdS or CdSe, and a thickness of the first sensing film 141 may be between about 50 nm and about 300 nm.

The second sensing film 142 may include ZnO or GaN. In some embodiments, the second sensing film 142 may be formed by depositing ZnO, and in this case, the thickness of the second sensing film 142 may be between about 50 nm and about 300 nm. In other embodiments, the second sensing film 142 may be formed by spin-coating ZnO nano particles. In this case, the thickness of the second sensing film 142 may be between about 500 nm and about 1500 nm.

The first input electrode 120 may receive a first electrical signal and provide the first input acoustic waves to the first light sensing area LS1. The first output electrode 130 may be apart from the first input electrode 120 with the first delay gap DG1 therebetween and may generate the surface acoustic waves, which are changed by the sensing film 140, into electrical signals, thereby outputting the electrical signals.

The third input electrode 170 may receive a third electrical signal and provide third input acoustic waves to the second light sensing area LS2. The third output electrode 180 may be apart from the third input electrode 170 with the third delay gap DG3 and may generate surface acoustic waves, which are changed by the second sensing film 142, into electrical signals, thereby outputting the electrical signals.

The third input electrode 170 and the third output electrode 180 may be IDT electrodes. The IDT electrodes may include a plurality of IDT fingers 171 and 181 having comb shapes and two bar electrodes 173 and 183 respectively connected to the IDT fingers 171 and 181.

The bar electrode 173 of the third input electrode 170 may be connected to third input pads IN3*a* and IN3*b*, and the bar electrode 183 of the third output electrode 180 may be connected to third output pads OUT3*a* and OUT3*b*. Any one of the third input pads IN3*a* and IN3*b* and any one of the third output pads OUT3*a* and OUT3*b* may be used as ground electrode pads.

In some embodiments, the third input electrode 170 and the third output electrode 180 may include Al, and thicknesses of the third input electrode 170 and the third output electrode 180 may be between about 100 nm and about 300 nm.

In the present embodiment, the optical sensor device 40 has the first light sensing area LS1, the second light sensing area LS2, and the temperature sensing area TS and thus may function as a composite sensor capable of simultaneously measuring intensity of light, ultraviolet rays, and a temperature.

The optical sensor device 40 according to the present embodiment is designed to have a tiny size of less than or equal to about 2.5 mm×2.5 mm. Also, in order to minimize an ROIC, which is connected to the optical sensor device 40 and detects a frequency change of the acoustic waves, Q values of the acoustic waves obtained by the optical sensor device 40 are set to be greatly high.

To satisfy the conditions, the first sensing film 141 that detects the light amount may cover the IDT fingers 121 of the first input electrode 120 and the IDT fingers 131 of the first output electrode 130. The second sensing film 142 covers the IDT fingers 171 of the third input electrode 170 and the IDT fingers 181 of the third output electrode 180. The purpose of such alignment is to maximally secure a detection area to correspond to a spatial limit of the optical sensor device 40 and restrict at most reflective waves that may be generated due to the reflection.

The center frequency of the acoustic waves that are output from the optical sensor device 40 may be set to be between about 200 MHz and about 300 MHz because, when the center frequency is equal to or greater than 300 MHz, noise increases, and thus a design of the ROIC may become complicated, or a size thereof may increase, and when the center frequency is less than or equal to 200 MHz, sizes of input and output electrodes increase.

When the center frequency of the acoustic waves that are output from the optical sensor device 40 is referred to as a first peak, a value of a Q factor (a bandwidth/center frequency of 3 dB) at the first peak may be great. In this way, frequency sweeping in the ROIC is reduced by reducing a bandwidth of the first peak, and it is easy to identify a change in a first peak value. In some embodiments, the Q factor at the first peak may be between about 200 and about 600, and preferably between about 240 and about 500.

Also, the acoustic waves output from the optical sensor device 40 may have a second peak having a next insertion loss other than the center frequency (the first peak), and thus, a difference between insertion losses of the first and second peaks may be designed to be equal to or greater than 3 dB. As the difference between insertion losses of the first and second peaks increases, the first peak may not be confused with the second peak, and the capacity of the ROIC may be reduced.

In the present embodiment, the following design parameters have been secured to ensure that the spatial limit is less than or equal to 2.5 mm×2.5 mm, the difference between the insertion losses of the first and second peaks is equal to or greater than 3 dB, and the Q factor at the first peak is maximized.

First of all, the number of IDT fingers included in each of the first input electrode 120, the first output electrode 130, the third input electrode 170, and the third output electrode 180 may preferably be between about 35 and about 121.

Also, a distance between centers of the IDT fingers may be adjusted to be about $\lambda/2$, and $\lambda/2$ may range from about 6.6 um to about 10 um. A width of one of the fingers may be between about 3.3 um to and about 4.1 um. The first delay gap DG1 and/or the third delay gap DG3 may be between about 15 um and about 600 um. Apertures of the first delay gap DG1 and/or the third delay gap DG3 may be between about 300 um and about 650 um.

Figure 8:
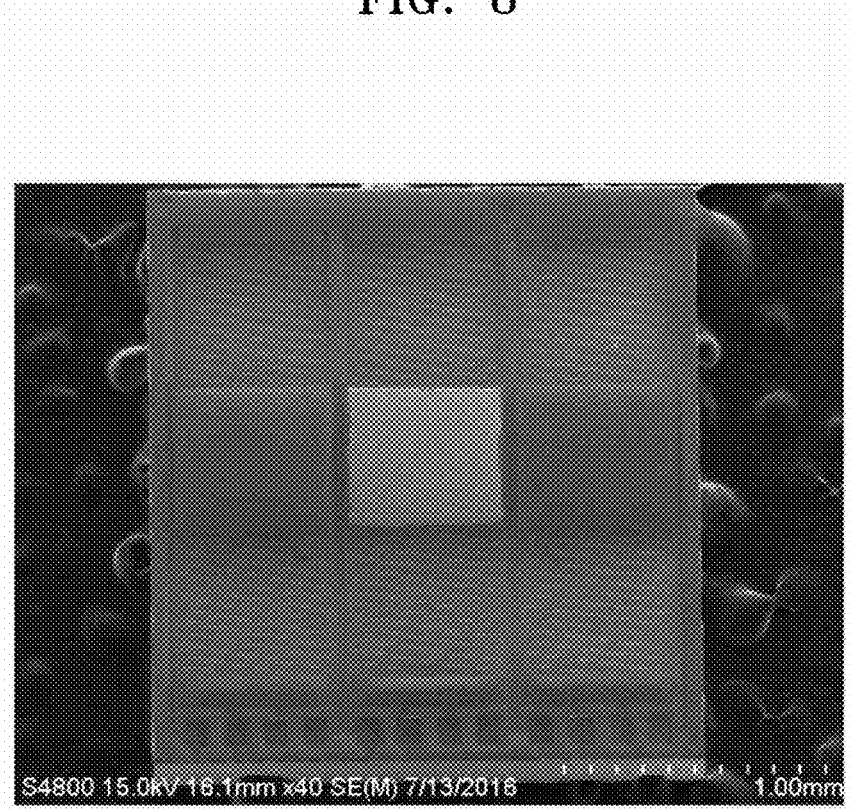
FIG. 8 is an image obtained by capturing a shape of the optical sensor device of FIG. 7.

FIG. 8 is an image obtained by capturing a shape of the optical sensor device 40 of FIG. 7. Referring to FIG. 8, a visible light sensing area, a ultraviolet ray sensing area, and a temperature sensing area are disposed on a substrate from the left side, and the total size of the optical sensor device 40 is about 2 mm×2 mm.

Figure 9:
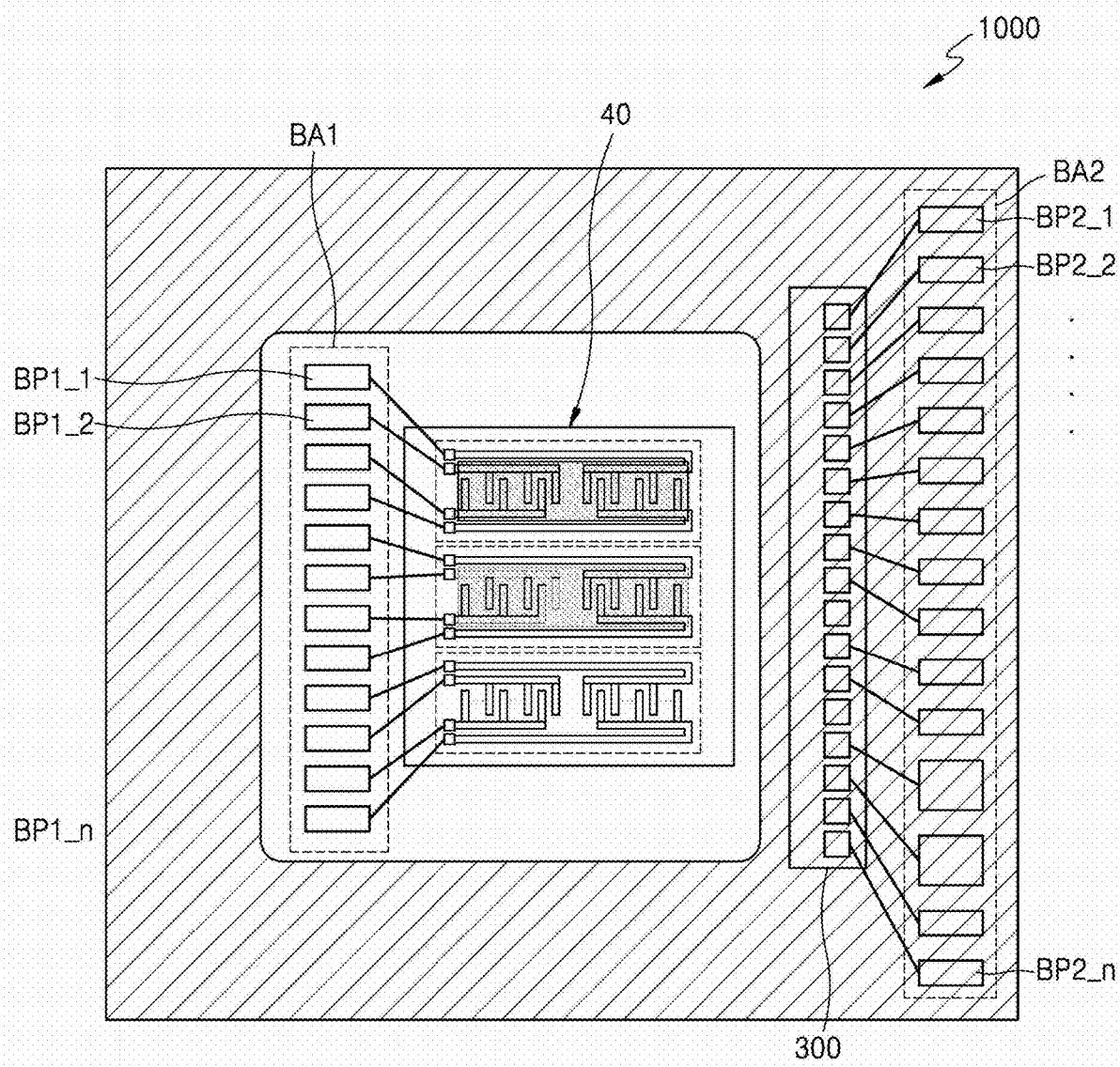
FIG. 9 is a plan view of an optical sensor device package including optical sensor devices according to one or more embodiments.
Figure 10:
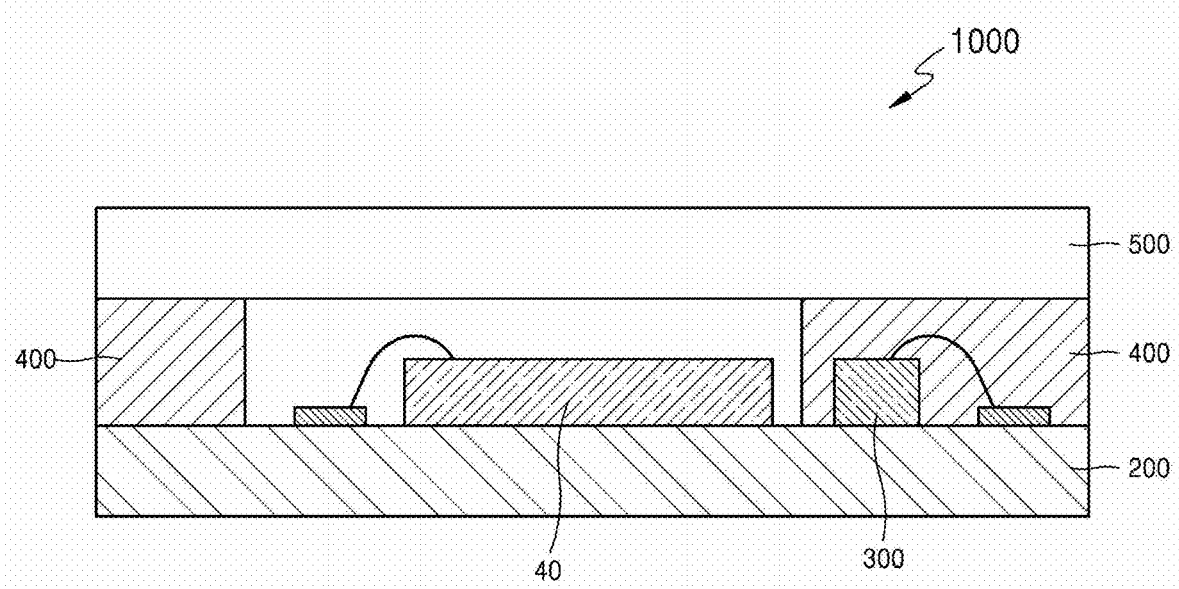
FIG. 10 is a schematic cross-sectional view of the optical sensor device package.

FIG. 9 is a plan view of an optical sensor device package 1000 including optical sensor devices according to one or more embodiments. FIG. 10 is a schematic cross-sectional view of the optical sensor device package 1000. FIGS. 9 and 10 show that the optical sensor device 40 of FIG. 7 is packaged. However, the optical sensor devices 10, 20, and 30 of FIGS. 1 to 6 may be included, and a transformed optical sensor device may also be included.

Referring to FIGS. 9 and 10, the optical sensor device package 1000 includes a circuit board 200 including a first bonding pad area BA1 and a second bonding pad area BA2, the optical sensor device 40 and an IC chip 300 mounted on the circuit board 200, molding portions 400 surrounding the optical sensor device 40 and molding the IC chip 300, and a transparent board 500 forming an air gap with the optical sensor device 40

The circuit board 200 includes the first bonding pad area BA1 and the second bonding pad area BA2. The first bonding pad area BA1 includes first bonding pads BP1_1 to BP1_$n$, and the first bonding pads BP1_1 to BP1_$n$ may be respectively connected to electrode pads of the optical sensor device 40 through wire bonding, etc. The second bonding pad area BA2 includes second bonding pads BP2_1 to BP2_$n$, and the second bonding pads BP2_1 to BP2_$n$ may be respectively connected to terminals of the IC chip 300 through wire bonding, flip chip bonding, or the like.

The first bonding pads BP1_1 to BP1_$n$ may be aligned in a row on an outer side of the optical sensor device 40. The second bonding pads BP2_1 to BP2_$n$ may be aligned in a row on an outer side of the IC chip 300. The second bonding pad area BA2 may correspond to one side of the circuit board 200 at an edge thereof.

The circuit board 200 may include a layer or layers, and wires that connect the first bonding pad area BA1 and the second bonding pad area BA2 to each other may be formed on or in the circuit board 200.

The IC chip 300 may include an ROIC, generate input acoustic waves, and calculate a light amount and a temperature value by reading frequency responses of output acoustic waves.

The optical sensor device 40 is disposed at the center of the circuit board 200, and on an edge of the circuit board 200, the molding portions 400 may be disposed to surround the optical sensor device 40. The molding portions 400 may mold the IC chip 300 and the second bonding pad area BA2 and prevent external noise from affecting the IC chip 300.

Above the optical sensor device 40, the transparent board 500 forming the air gap with the optical sensor device 40 may be formed. The transparent board 500 may include a glass material.

The transparent board 500 not only allows the optical sensor device 40 to measure the light amount by penetrating light but also protects the optical sensor device 40 from foreign materials.

Figure 11:
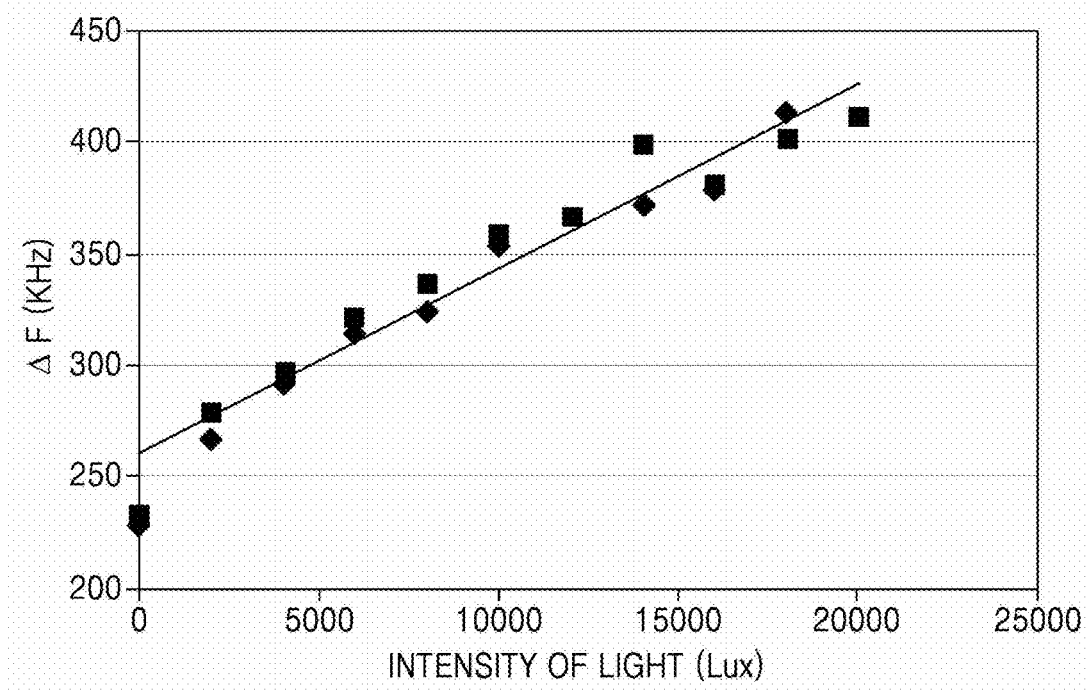
FIG. 11 is a graph showing a variation in a center frequency of output acoustic waves according to a light amount, according to an embodiment.
Figure 12:
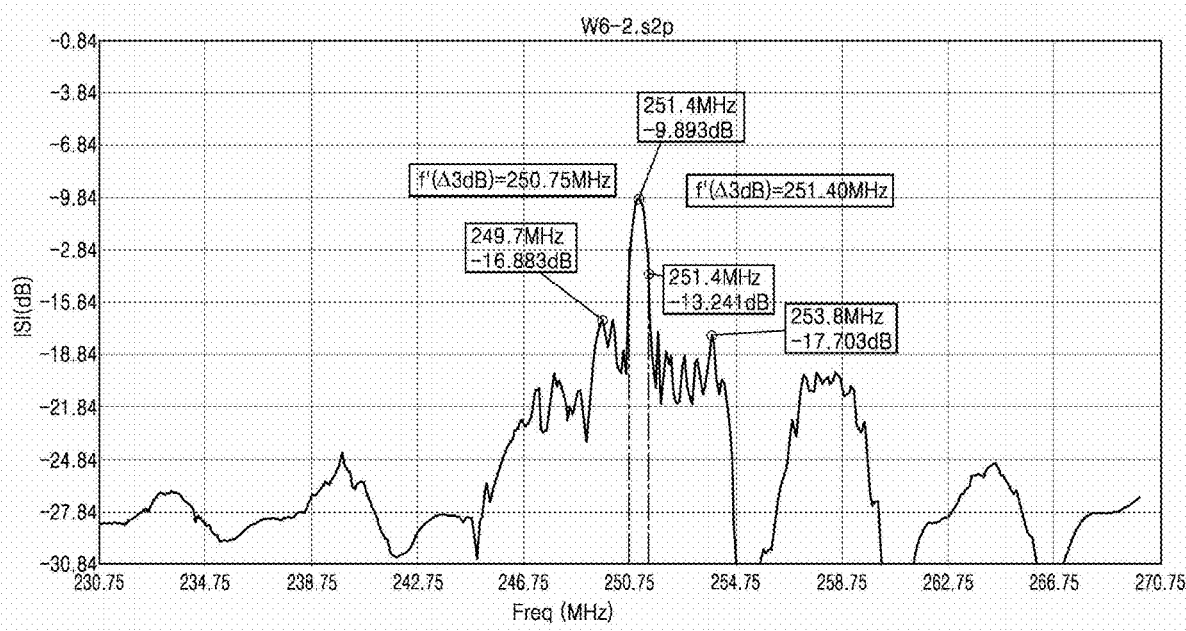
FIG. 12 is a graph showing a waveform of an output acoustic wave, according to an embodiment.

FIGS. 11 and 12 are graphs showing measurements of performance of an optical sensor device, according to an embodiment. FIG. 11 shows data obtained by measuring a change $\Delta F$ in a center frequency of acoustic waves, which are output from a light sensing area where visible light is detected. A value of the change $\Delta F$ may be a value from which an influence on the temperature is removed based on a value of a center frequency of acoustic waves output from a temperature sensing area. Referring to FIG. 11, a change in a center frequency of acoustic waves output from a visible light area linearly increases according to an increase in intensity of light, and the change amounts to several hundreds of KHz.

FIG. 12 is a graph showing a waveform of an output acoustic wave, according to an embodiment. Referring to FIG. 12, a center frequency fc of the acoustic wave according to the present embodiment is 251.1 MHz, and a 3 dB bandwidth measures f"($\Delta 3$ dB)−f'($\Delta 3$ dB)=251.4−250.75

MHz=0.65 MHz. Accordingly, it is found that a Q factor of the acoustic wave equals to 251.1/0.65=386.3.

Also, the first peak (i.e., the center frequency) at which the insertion loss is the smallest among the acoustic waves is 251.1 MHz, and in this case, the insertion loss is −9.9 dB. A second peak at which a next insertion loss is 249.7 MHz, and in this case, the insertion loss is −16.9 dB. Accordingly, a difference between the insertion losses at the first and second peaks is 7.0 dB.

An optical sensor device and an optical sensor device package according to the one or more embodiments may simultaneously measure a light amount and a temperature. Output acoustic waves have high Q values, and thus, the optical sensor device and the optical sensor device package may have high measurement reliability despite small sizes thereof.

An optical sensor device according to the one or more embodiments may include a light sensing area and a temperature sensing area and thus may simultaneously the light amount and the temperature. Also, since second acoustic waves used to measure temperature values may be used as reference values of first output acoustic waves, the light amount may be measured regardless of the temperature values.

The optical sensor device according to the one or more embodiments has a small size but has high Q values and thus may use an IC chip having low capacity. Accordingly, the total size of the optical sensor device package may be reduced. However, the scope of the present disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. An optical sensor package comprising:
   a printed circuit board comprising a first bonding pad area and a second bonding pad area;
   an optical sensor device disposed on the printed circuit board and connected to the first bonding pad area through wire bonding;
   an integrated circuit (IC) chip disposed on the printed circuit board and connected to the second bonding pad area;
   molding portions surrounding the optical sensor device and molding the second bonding pad area and the IC chip; and
   a transparent substrate disposed on the molding portions and forming an air gap with the optical sensor device,
   wherein the optical sensor device comprises:
      a substrate comprising a first light sensing area and a temperature sensing area and comprising a piezo electric material;
      a first input electrode and a first output electrode which are disposed in the first light sensing area and are apart from each other with a first delay gap between the first input electrode and the first output electrode;
      a first sensing film overlapping the first delay gap and configured to cover at least some portions of the first input electrode and the first output electrode; and
      a second input electrode and a second output electrode which are disposed in the temperature sensing area and are apart from each other with a second delay gap between the second input electrode and the second output electrode, and
      wherein the second delay gap is exposed to air.

2. The optical sensor device of claim 1, wherein the first input electrode is configured to receive a first electrical signal and provide a first input acoustic wave to the first light sensing area,
   the first output electrode is configured to output a first output acoustic wave modulated by the first sensing film of which properties change according to external light,
   the second input electrode is configured to receive a second electrical signal and provide a second input acoustic wave to the temperature sensing area, and
   the second output electrode is configured to output a second output acoustic wave modulated by the substrate exposed to the air, wherein properties of the substrate exposed to the air change according to a temperature.

3. The optical sensor device of claim 2, wherein the first output acoustic wave has a first peak and a second peak in a range from about 200 MHz to about 300 MHz,
   a Q factor at the first peak is between about 200 and about 600, and
   a difference between insertion losses of the first peak and the second peak is equal to or greater than 3 dB.

4. The optical sensor device of claim 1, wherein the first input electrode and the first output electrode comprise Inter Digit Transducer (IDT) electrodes comprising a plurality of fingers having comb shapes, and
   the first sensing film is configured to cover all of the plurality of fingers.

5. The optical sensor device of claim 4, wherein a number of fingers comprised in the first input electrode and the first output electrode is between 35 and 121.

6. The optical sensor device of claim 1, further comprising a ground electrode disposed between the first light sensing area and the temperature sensing area,
   wherein the first input electrode and the second input electrode are symmetrically disposed with respect to the ground electrode.

7. The optical sensor device of claim 1, wherein the first input electrode, the first output electrode, the second input electrode, and the second output electrode comprise a plurality of Inter Digit Transducer (IDT) fingers and a plurality of bar electrodes,
   the first input electrode, the first output electrode, the second input electrode, and the second output electrode are aligned in a row on a side of the substrate, and
   lengths of the plurality of bar electrodes of the first output electrode and the second output electrode are different from lengths of the plurality of bar electrodes of the first input electrode and the second input electrode.

8. The optical sensor device of claim 1, wherein the first input electrode, the first output electrode, the second input electrode, and the second output electrode comprise a plurality of Inter Digit Transducer (IDT) electrodes comprising a plurality of IDT fingers and a plurality of bar electrodes, and a first aperture, which is a length in which the plurality of IDT fingers comprised in the first input electrode cross and overlap each other; and a second aperture, which is a length in which the plurality of IDT fingers comprised in the second electrode cross and overlap each other, wherein the first aperture is greater than the second aperture.

9. The optical sensor device of claim 1, wherein the substrate comprises a second light sensing area that is close to the first light sensing area, in the second light sensing area, a third input electrode, a third output electrode, which are apart from each other with a third delay gap between the third input electrode and the third output electrode, and a second sensing film configured to cover the third delay gap are disposed, and one of the first sensing film and the second sensing film is configured to detect visible light, and the other of the first sensing film and the second sensing film is configured to detect ultraviolet rays.

* * * * *